(12) United States Patent
Kremmel

(10) Patent No.: US 12,193,191 B2
(45) Date of Patent: Jan. 7, 2025

(54) DOMESTIC APPLIANCE AND BOARD HOUSING

(71) Applicant: Haier US Appliance Solutions, Inc., Wilmington, DE (US)

(72) Inventor: Aldo Vincent Kremmel, Palmyra, IN (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 128 days.

(21) Appl. No.: 17/884,696

(22) Filed: Aug. 10, 2022

(65) Prior Publication Data

US 2024/0057293 A1 Feb. 15, 2024

(51) Int. Cl.
*H05K 7/20* (2006.01)
*A47L 15/42* (2006.01)
*H05K 5/02* (2006.01)

(52) U.S. Cl.
CPC ...... *H05K 7/20445* (2013.01); *A47L 15/4274* (2013.01); *H05K 5/0226* (2013.01)

(58) Field of Classification Search
CPC .................................................. H05K 7/20445
See application file for complete search history.

(56) References Cited

U.S. PATENT DOCUMENTS

| | | | |
|---|---|---|---|
| 7,821,791 B2 | 10/2010 | Popp et al. | |
| 9,036,356 B2 | 5/2015 | Baba et al. | |
| 9,907,208 B2 | 2/2018 | Bose et al. | |
| 11,098,733 B2* | 8/2021 | Guntermann | ......... F04D 29/601 |
| 2013/0255327 A1* | 10/2013 | Park | ......... D06F 34/34 |
| | | | 68/13 R |
| 2022/0046809 A1* | 2/2022 | Lindstedt | ............. H05K 5/0017 |

* cited by examiner

*Primary Examiner* — Mukundbhai G Patel
(74) *Attorney, Agent, or Firm* — Dority & Manning, P.A.

(57) ABSTRACT

An appliance or board housing may include a housing pan, a printed circuit board (PCB), a spacer frame, and a thermally conductive insulator pad (TCIP). The housing pan may define an internal bottom surface. The PCB may be held within the housing pan above the internal bottom surface. The spacer frame may include a skeletal platform extending beneath the PCB in support thereof. The TCIP may be held on the spacer frame between PCB and the housing pan.

20 Claims, 10 Drawing Sheets

DOMESTIC APPLIANCE AND BOARD HOUSING

FIELD OF THE INVENTION

The present subject matter relates generally to domestic appliances, and more particularly to housings for one or more electronics or circuit boards of a domestic appliance.

BACKGROUND OF THE INVENTION

In manufacturing, parts are often put together in stages or steps. Each component added to a manufacturing piece may add a step to assembly and installation of the components into the manufacturing piece. Additionally, having many components in a manufacturing piece may complicate or extend repair time. For example, placing parts together by the use of screws takes time, both during manufacturing and when making repairs.

Housings in manufactured pieces, such as appliances, may house or partially envelop more fragile pieces such as electronic components such as wiring for control panels or circuitry for a controller. For example, electronic components may benefit from a housing in appliances such as dishwashers, refrigerators, washers, dryers, ovens, ranges, and the like. Housings may provide a level of stability or some protection to such elements and may be beneficial. To house the components, separate housing elements may be connected together by a screw or a set of screws. Housings may also be connected to other components by use of at least one screw. Hence, housing components such as electrical components may require many components, each component adding time to manufacturing or repair processes. Each component may further contribute to costs, both in assembly and manufacture of the manufacturing piece and in repair and maintenance of the manufacturing piece. Moreover, even with multiple discrete pieces, ensuring the proper alignment of each piece may be difficult and time consuming.

Accordingly, a housing component that could connect and contain other components without the use of a screw would be useful. For example, an appliance with fewer components, would also be desirable.

BRIEF DESCRIPTION OF THE INVENTION

Aspects and advantages of the invention will be set forth in part in the following description, or may be obvious from the description, or may be learned through practice of the invention.

In one exemplary aspect of the present disclosure, an appliance board housing is provided. The appliance board housing may include a housing pan, a printed circuit board (PCB), a spacer frame, and a thermally conductive insulator pad (TCIP). The housing pan may define an internal bottom surface. The PCB may be held within the housing pan above the internal bottom surface. The spacer frame may include a skeletal platform extending beneath the PCB in support thereof. The TCIP may be held on the spacer frame between PCB and the housing pan.

In another exemplary aspect of the present disclosure, a domestic appliance is provided. The domestic appliance may include a cabinet and a board housing. The cabinet may define a vertical direction. The board housing may be movably attached to the cabinet. The board housing may include a housing pan, a printed circuit board (PCB), a spacer frame, and a thermally conductive insulator pad (TCIP). The housing pan may define an internal bottom surface. The PCB may be held within the housing pan above the internal bottom surface. The spacer frame may include a skeletal platform extending beneath the PCB in support thereof. The TCIP may be held on the spacer frame between PCB and the housing pan.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

Figure 1:
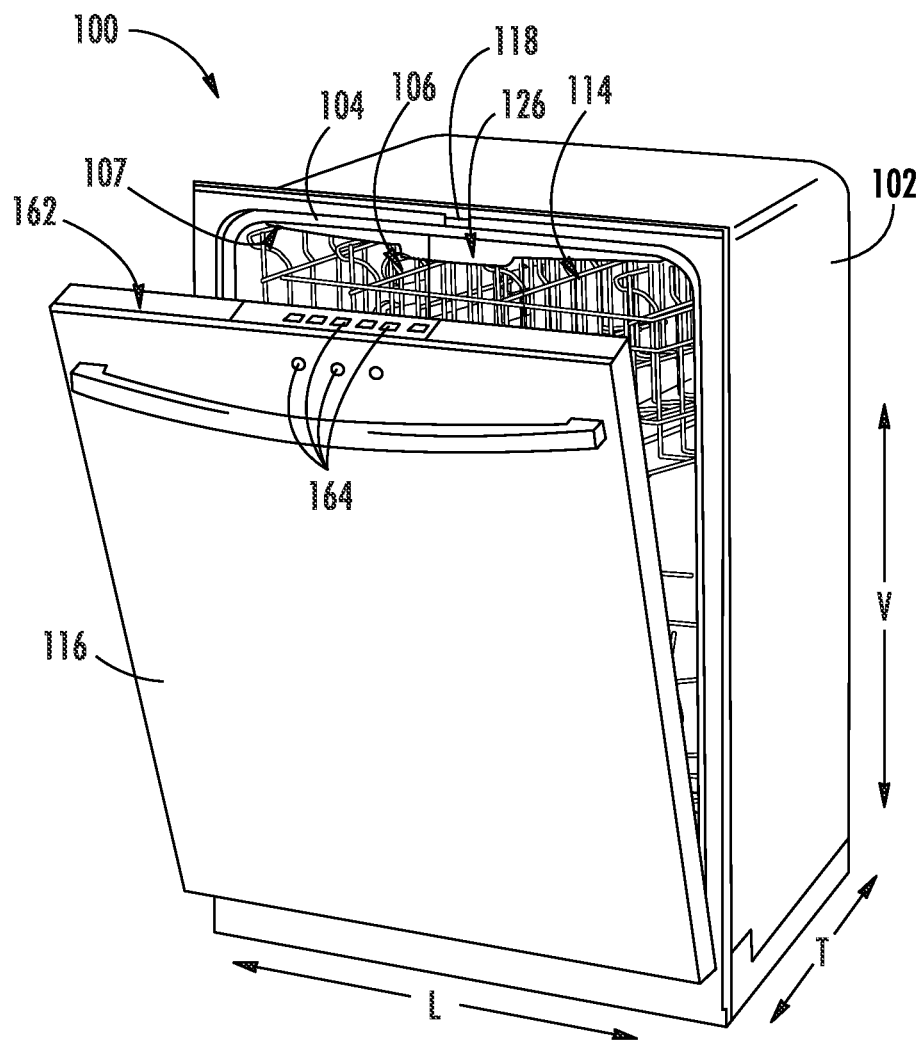
FIG. 1 provides a perspective view of a domestic appliance provided as a dishwasher appliance according to exemplary embodiments of the present disclosure.

Repeat use of reference characters in the present specification and drawings is intended to represent the same or analogous features or elements of the present invention.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "first," "second," and "third" may be used interchangeably to distinguish one component from another and are not intended to signify location or importance of the individual components. The terms "includes" and "including" are intended to be inclusive in a manner similar to the term "comprising." Similarly, the term "or" is generally intended to be inclusive (i.e., "A or B" is intended to mean "A or B or both"). In addition, here and throughout the specification and claims, range limitations may be combined or interchanged. Such ranges are identified and include all the sub-ranges contained therein unless context or language indicates otherwise. For example, all ranges disclosed herein are inclusive of the endpoints, and the endpoints are independently combinable with each other. The singular forms "a," "an," and "the" include plural references unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "generally," "about," "approximately," and "substantially," are not to be limited to the precise value specified. In at least some instances, the approximating language may correspond to the precision of an instrument for measuring the value, or the precision of the methods or machines for constructing or manufacturing the components or systems. For example, the approximating language may refer to being within a 10 percent margin (i.e., including values within ten percent greater or less than the stated value). In this regard, for example, when used in the context of an angle or direction, such terms include within ten degrees greater or less than the stated angle or direction (e.g., "generally vertical" includes forming an angle of up to ten degrees in any direction, such as, clockwise or counterclockwise, with the vertical direction V).

The word "exemplary" is used herein to mean "serving as an example, instance, or illustration." In addition, references to "an embodiment" or "one embodiment" does not necessarily refer to the same embodiment, although it may. Any implementation described herein as "exemplary" or "an embodiment" is not necessarily to be construed as preferred or advantageous over other implementations. Moreover, each example is provided by way of explanation of the invention, not limitation of the invention. In fact, it will be apparent to those skilled in the art that various modifications and variations can be made in the present invention without departing from the scope of the invention. For instance, features illustrated or described as part of one embodiment can be used with another embodiment to yield a still further embodiment. Thus, it is intended that the present invention covers such modifications and variations as come within the scope of the appended claims and their equivalents.

Embodiments of the present disclosure include a board housing that may be on or inside a cabinet and that encases an electronic component, such as a circuit board. The board housing may include a spacer frame (e.g., formed as single piece) to electrically insulate the electronic component. The spacer frame may have one or more holes or doors that can engage with other features of the board housing and ensure proper alignment of the board housing.

Figure 2:
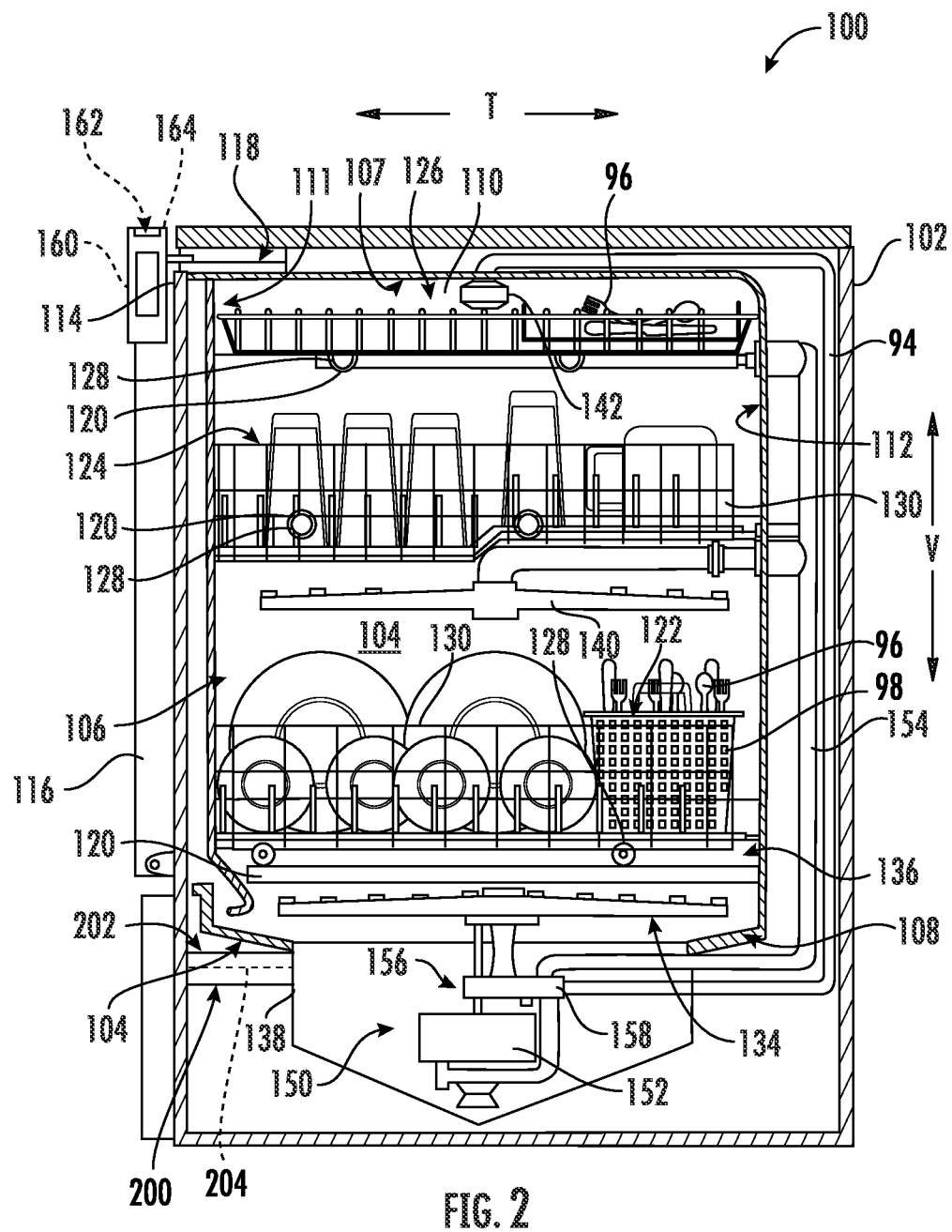
FIG. 2 provides a side, section view of the exemplary dishwasher appliance of FIG. 1.

As will be understood by those skilled in the art, dishwasher appliance 100 is provided by way of example only, and the present subject matter may be used in any suitable household appliance. Thus, the present subject matter may be used with other dishwasher appliances having different configurations. The present subject matter may further be used with other household appliances such as microwave ovens, washing machine appliances, dryer appliances, dishwashing appliances, refrigerator appliances, etc. Dishwasher appliance 100 will be described below, with the understanding that other embodiments may include or be provided as another suitable household appliance (e.g., defining an internal chamber). Referring now to the figures, an exemplary appliance will be described in accordance with exemplary aspects of the present subject matter. Specifically, FIG. 1 provides a perspective view of an exemplary domestic dishwasher appliance 100 and FIG. 2 provides a side cross-sectional view of appliance 100. As illustrated, appliance 100 generally defines a vertical direction V, a lateral direction L, and a transverse direction T, each of which is mutually perpendicular, such that an orthogonal coordinate system is generally defined.

According to exemplary embodiments, appliance 100 includes a cabinet 102 that is generally configured for containing and/or supporting various components of appliance 100 and which may also define one or more internal chambers or compartments of appliance 100. In this regard, as used herein, the terms "cabinet," "housing," and the like are generally intended to refer to an outer frame or support structure for appliance 100, e.g., including any suitable number, type, and configuration of support structures formed from any suitable materials, such as a system of elongated support members, a plurality of interconnected panels, or some combination thereof. It should be appreciated that cabinet 102 does not necessarily require an enclosure and may simply include open structure supporting various elements of appliance 100. By contrast, cabinet 102 may enclose some or all portions of an interior of cabinet 102. It should be appreciated that cabinet 102 may have any suitable size, shape, and configuration while remaining within the scope of the present subject matter.

As illustrated, cabinet 102 generally extends between a top 107 and a bottom 108 along the vertical direction V, between a first side 109 (e.g., the left side when viewed from the front as in FIG. 1) and a second side 110 (e.g., the right side when viewed from the front as in FIG. 1) along the lateral direction L, and between a front 111 and a rear 112 along the transverse direction T. In general, terms such as "left," "right," "front," "rear," "top," or "bottom" are used with reference to the perspective of a user accessing appliance 100.

For the particular embodiment of FIGS. 1 and 2, the dishwasher 100 includes a cabinet 102 (FIG. 2) having a tub 104 therein that defines a wash chamber 106. As shown in FIG. 2, tub 104 extends between a top 107 and a bottom 108 along a vertical direction V, between a pair of side walls 110 along a lateral direction L, and between a front side 111 and a rear side 112 along a transverse direction T. Each of the vertical direction V, lateral direction L, and transverse direction T are mutually perpendicular to one another.

The tub 104 includes a front opening 114 and a door 116 hinged at its bottom for movement between a normally closed vertical position (shown in FIG. 2), wherein the wash chamber 106 is sealed shut for washing operation, and a horizontal, fully open position for loading and unloading of articles from the dishwasher 100. According to exemplary embodiments, dishwasher 100 further includes a door closure mechanism or assembly 118 that is used to lock and unlock door 116 for accessing and sealing wash chamber 106.

As best illustrated in FIG. 2, tub side walls 110 accommodate a plurality of rack assemblies. For instance, guide rails 120 may be mounted to side walls 110 for supporting a first rack assembly 122 (also referred to as a lower rack assembly 122), a middle rack assembly 124 (also referred to as a second rack assembly 124), and a third rack assembly 126 (also referred to as an upper rack assembly 126). As illustrated, third rack assembly 126 is positioned at a top portion of wash chamber 106 above middle rack assembly 124, which is positioned above lower rack assembly 122 along the vertical direction V. Each rack assembly 122, 124, 126 is adapted for movement between an extended loading position (not shown) in which the rack is substantially positioned outside the wash chamber 106, and a retracted position (shown in FIGS. 1 and 2) in which the rack is located inside the wash chamber 106. This is facilitated, for example, by rollers 128 mounted onto rack assemblies 122, 124, 126, respectively. Although a guide rails 120 and rollers 128 are illustrated herein as facilitating movement of the respective rack assemblies 122, 124, 126, it should be appreciated that any suitable sliding mechanism or member may be used according to alternative embodiments.

Some or all of the rack assemblies 122, 124, 126 are fabricated into lattice structures including a plurality of wires or elongated members 130 (for clarity of illustration, not all elongated members making up rack assemblies 122, 124, 126 are shown in FIG. 2). In this regard, rack assemblies 122, 124, 126 are generally configured for supporting articles within wash chamber 106 while allowing a flow of wash fluid to reach and impinge on those articles, e.g., during a cleaning or rinsing cycle. For this embodiment, a silverware basket 98 is removably attached to a rack assembly, e.g., lower rack assembly 122, for placement of silverware 96, utensils, and the like, that are otherwise too small or delicate to be accommodated by rack 122.

Dishwasher 100 further includes a plurality of spray assemblies for urging a flow of water or wash fluid onto the articles placed within wash chamber 106. More specifically, as illustrated in FIG. 2, dishwasher 100 includes a first spray assembly 134 (also referred to as a lower spray arm assembly 134) disposed in a lower region 136 of wash chamber 106 and above a sump 138 so as to rotate in relatively close proximity to lower rack assembly 122. Similarly, a second spray assembly 140 (also referred to as a mid-level spray arm assembly 140) is located in an upper region of wash chamber 106 and may be located below and in close proximity to middle rack assembly 124. In this regard, mid-level spray arm assembly 140 may generally be configured for urging a flow of wash fluid up through middle rack assembly 124 and third rack assembly 126. Additionally, a third spray assembly 142 (also referred to as an upper spray assembly 142) may be located above third rack assembly 126 along the vertical direction V. In this manner, third spray assembly 142 may be configured for urging or cascading a flow of wash fluid downward over rack assemblies 122, 124, and 126.

The various spray assemblies and manifolds described herein may be part of a fluid distribution system or fluid circulation assembly 150 for circulating water and wash fluid in the tub 104. More specifically, fluid circulation assembly 150 includes a pump 152 for circulating water and wash fluid (e.g., detergent, water, or rinse aid) in the tub 104. Pump 152 may be located within sump 138 or within a machinery compartment located below sump 138 of tub 104, as generally recognized in the art. Fluid circulation assembly 150 may include one or more fluid conduits or circulation piping for directing water or wash fluid from pump 152 to the various spray assemblies and manifolds. For example, as illustrated in FIG. 2, a primary supply conduit 154 may extend from pump 152, along rear 112 of tub 104 along the vertical direction V to supply wash fluid throughout wash chamber 106.

As illustrated, primary supply conduit 154 is used to supply wash fluid to mid-level spray arm assembly 140 while a secondary supply conduit 94 supplies wash fluid to upper spray assembly 142. Diverter assembly 156 can allow selection between spray assemblies 134, 140 and 142 being supplied with wash fluid. However, it should be appreciated that according to alternative embodiments, any other suitable plumbing configuration may be used to supply wash fluid throughout the various spray manifolds and assemblies described herein.

Each spray assembly 134, 140, 142 or other spray device may include an arrangement of discharge ports or orifices for directing wash fluid received from pump 152 onto dishes or other articles located in wash chamber 106. The arrangement of the discharge ports, also referred to as jets, apertures, or orifices, may provide a rotational force by virtue of wash fluid flowing through the discharge ports. Alternatively, spray assemblies 134, 140, 142 may be motor-driven, or may operate using any other suitable drive mechanism. Spray manifolds and assemblies may also be stationary.

Movement of the spray arm assemblies 134 and 140 and the spray from fixed manifolds like spray assembly 142 provides coverage of dishes, silverware, and other dishwasher contents and articles to be cleaned with a washing spray. Other configurations of spray assemblies may be used as well. For example, dishwasher 100 may have additional spray assemblies for cleaning silverware, for scouring casserole dishes, for spraying pots and pans, for cleaning bottles, etc. One skilled in the art will appreciate that the embodiments discussed herein are used for the purpose of explanation only and are not limitations of the present subject matter.

In operation, pump 152 draws wash fluid in from sump 138 and pumps it to a diverter assembly 156, e.g., which is positioned within sump 138 of dishwasher appliance. Diverter assembly 156 may include a diverter disk (not shown) disposed within a diverter chamber 158 for selectively distributing the wash fluid to the spray assemblies 134, 140, 142 or other spray manifolds or devices. For example, the diverter disk may have a plurality of apertures that are configured to align with one or more outlet ports (not shown) at the top of diverter chamber 158. In this manner, the diverter disk may be selectively rotated to provide wash fluid to the desired spray device.

According to an exemplary embodiment, diverter assembly 156 is configured for selectively distributing the flow of wash fluid from pump 152 to various fluid supply conduits, only some of which (e.g., 94 and 154) are illustrated in FIG. 2 for clarity. More specifically, diverter assembly 156 may include four outlet ports (not shown) for supplying wash fluid to a first conduit for rotating lower spray arm assembly 134 in the clockwise direction, a second conduit for rotating lower spray arm assembly 134 in the counterclockwise direction, a third conduit for spraying rack assembly 126 as a silverware rack, and a fourth conduit for supplying only mid-level or upper spray assemblies 140, 142. Other configurations of diverter assembly 156 or other components (e.g., valves) may be used to allow various choices in the operation of the spray assemblies 134, 140, and 142 during a cleaning cycle.

The dishwasher 100 is further equipped with a controller 160 to regulate operation of the dishwasher 100. Controller 160 may include one or more memory devices and one or more microprocessors, such as general or special purpose microprocessors operable to execute programming instructions or micro-control code associated with a cleaning cycle. The memory may represent random access memory such as DRAM or read only memory such as ROM or FLASH. In one embodiment, the processor executes programming instructions stored in memory. The memory may be a separate component from the processor or may be included onboard within the processor. Alternatively, controller 160 may be constructed without using a microprocessor, e.g., using a combination of discrete analog or digital logic circuitry (such as switches, amplifiers, integrators, comparators, flip-flops, AND gates, and the like) to perform control functionality instead of relying upon software.

The controller 160 may be positioned in a variety of locations throughout dishwasher 100. In the illustrated embodiment, the controller 160 may be located within a control panel area 162 of door 116 as shown in FIGS. 1 and 2. In such an embodiment, input/output ("I/O") signals may be routed between the control system and various operational components of dishwasher 100 along wiring harnesses that may be routed through the bottom of door 116. Typically, the controller 160 includes a user interface panel/controls 164 through which a user may select various operational features and modes and monitor progress of the dishwasher 100. In one embodiment, the user interface 164 may represent a general purpose I/O ("GPIO") device or functional block. In one embodiment, the user interface 164 may include input components, such as one or more of a variety of electrical, mechanical, or electro-mechanical input devices including rotary dials, push buttons, and touch pads. The user interface 164 may include a display component, such as a digital or analog display device designed to provide operational feedback to a user. The user interface 164 may be in communication with the controller 160 via one or more signal lines or shared communication busses.

While dishwasher 100 is shown, it should be appreciated that the present disclosure is not limited to any particular appliance and could be used in any modular appliance or manufactured part, including washing machines, dryers, refrigerators, ovens, ranges, and any other component having circuitry that requires a housing for circuitry. For example, an apparatus with a bar and a circuit with housing may be provided. The exemplary embodiment depicted in FIGS. 1 and 2 is for illustrative purposes only. For example, an apparatus with a housing may be used, and other differences may be applied while remaining within the scope of the present subject matter.

Turning generally to FIGS. 2 through 12, an appliance board housing 200 (or portions thereof) is generally provided. As shown in FIG. 2, housing 200 may be located below tub 104. Additionally or alternatively, housing 200 may be attached to or supported by cabinet 102. In some embodiments, housing 200 is located internal to cabinet 102, in another location than that shown in FIG. 2.

Figure 3:
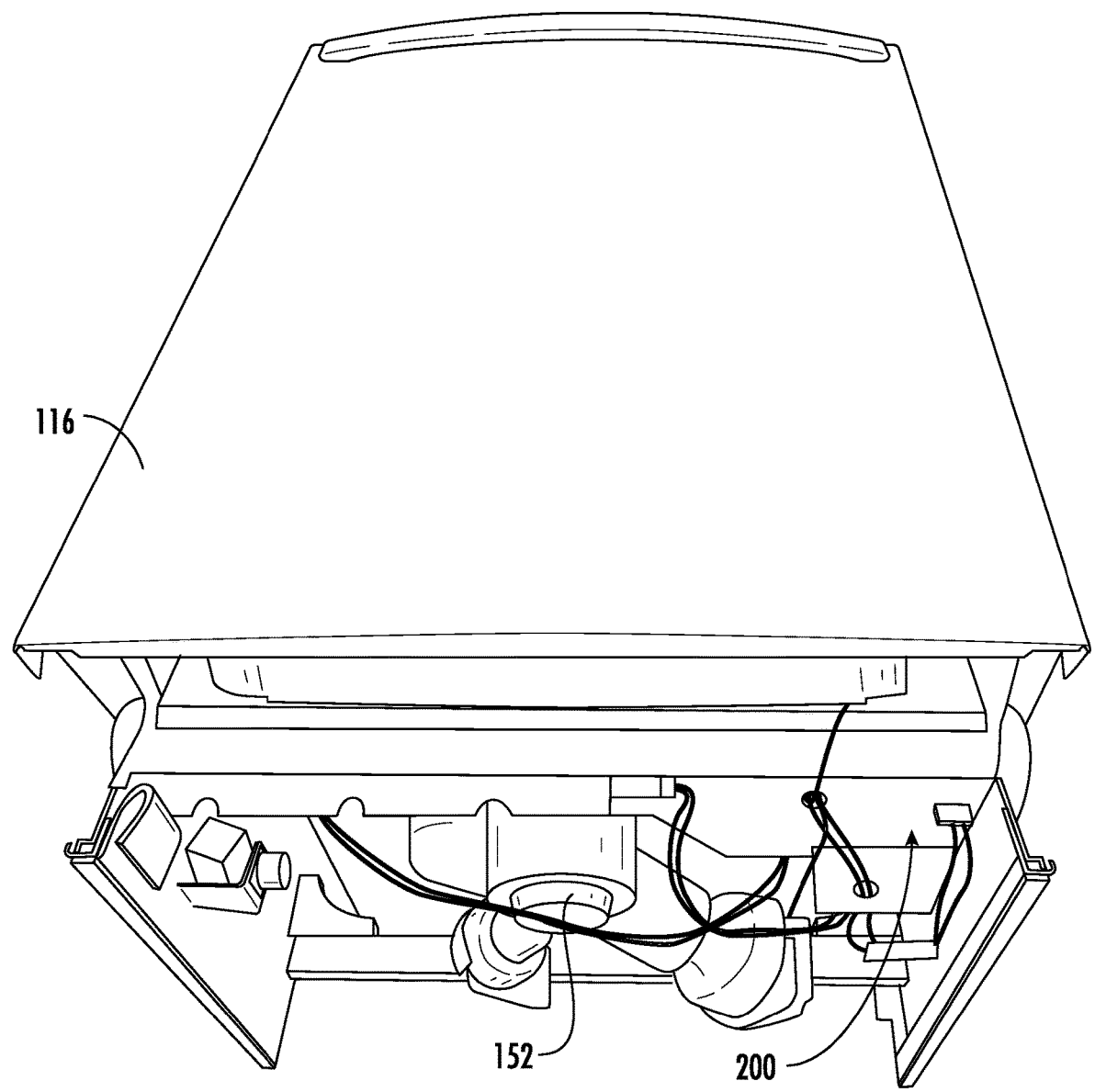
FIG. 3 provides a bottom perspective view of the exemplary dishwasher appliance of FIG. 1.
Figure 4:
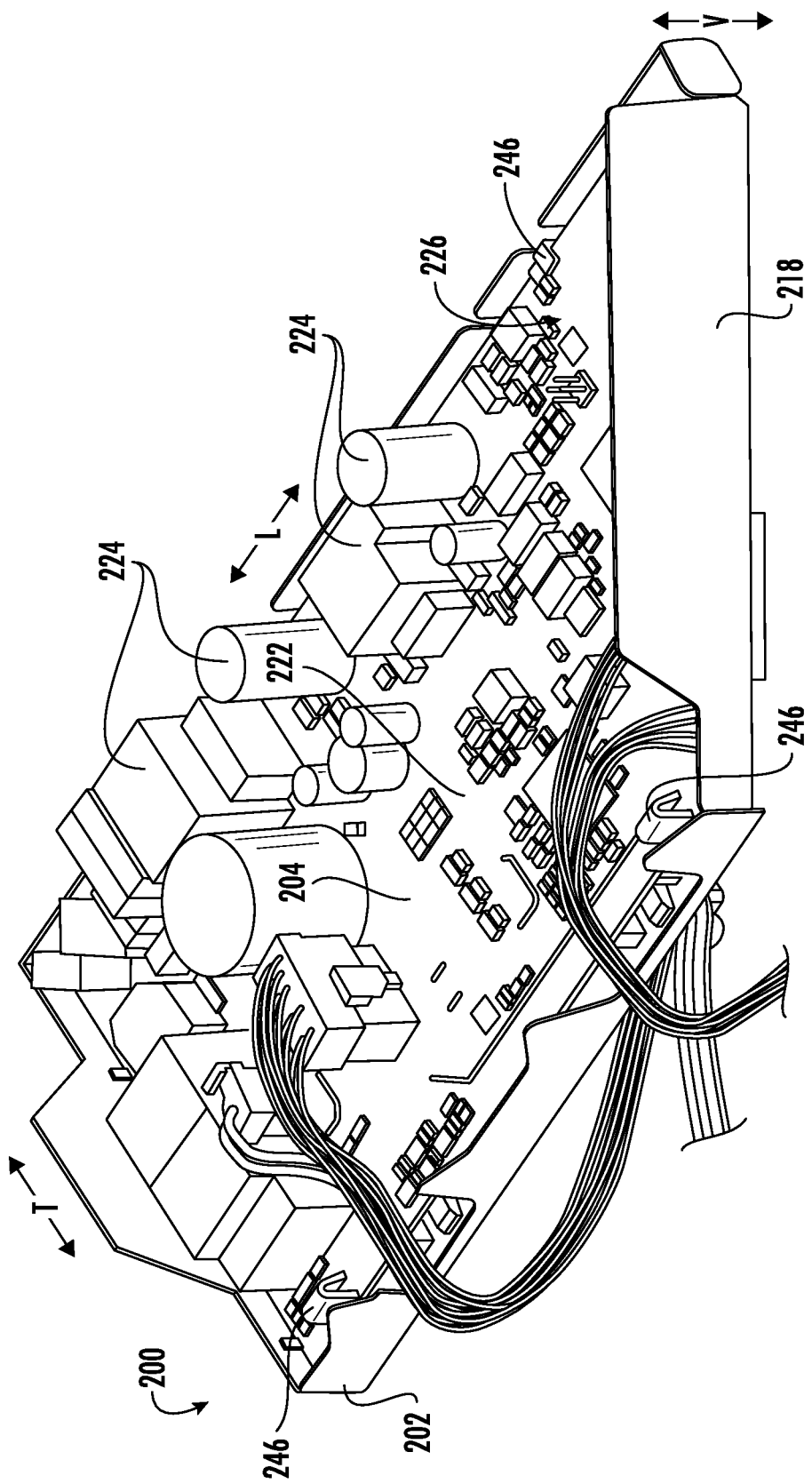
FIG. 4 provides a perspective view of a board housing, such as for a domestic appliance, according to exemplary embodiments of the present disclosure.
Figure 5:
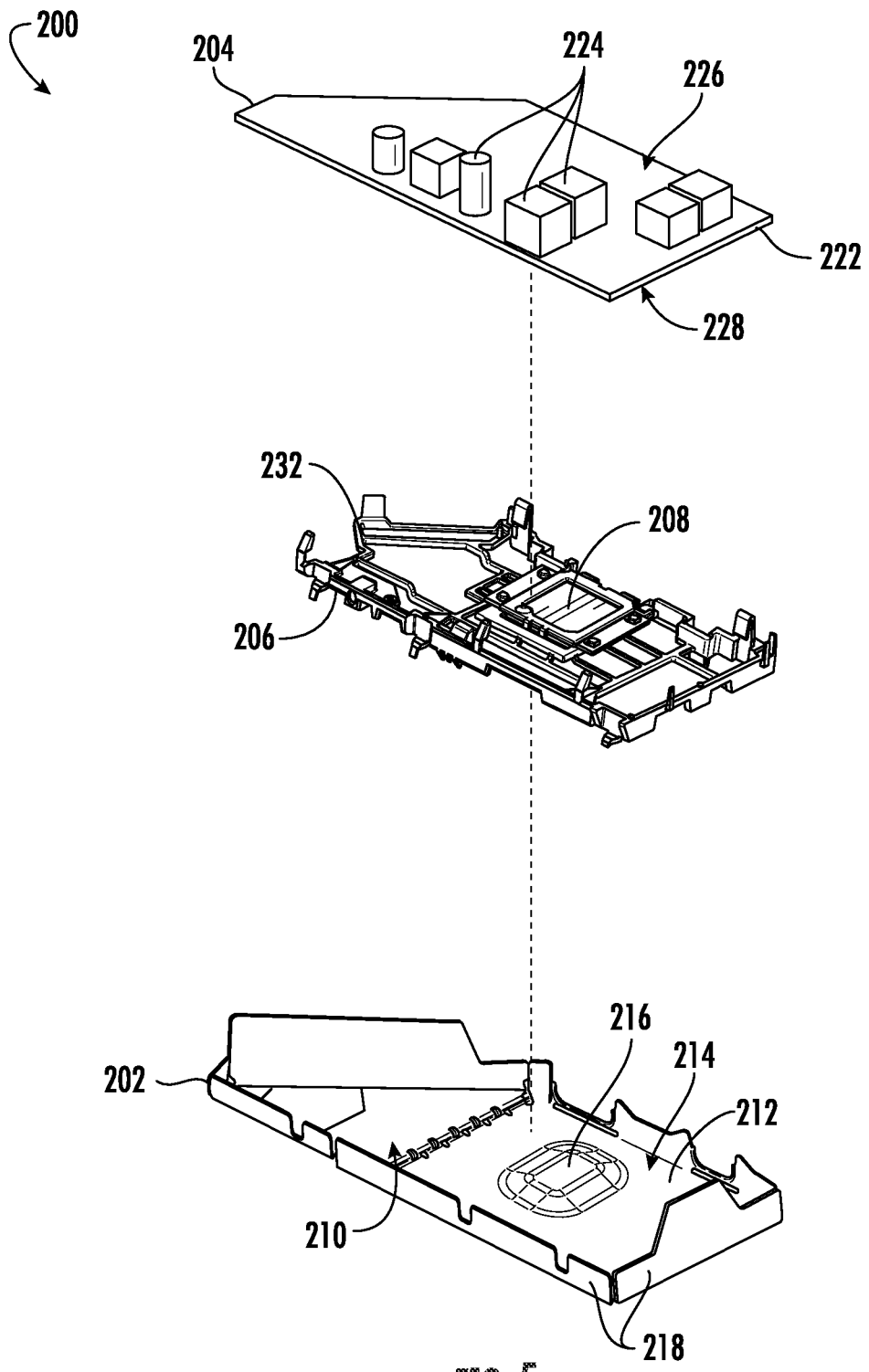
FIG. 5 provides an exploded perspective view of the exemplary board housing of FIG. 4.
Figure 6:
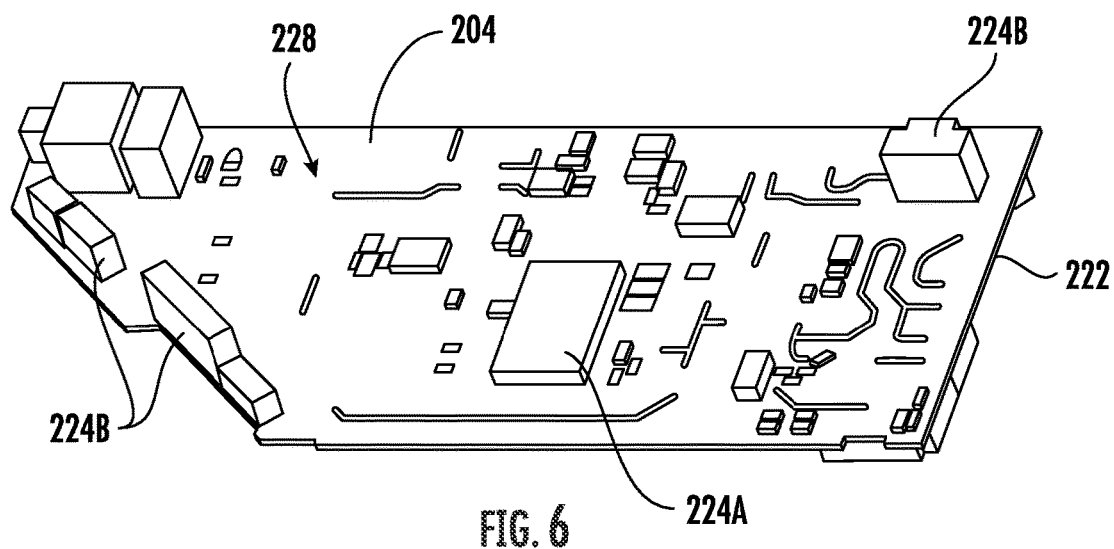
FIG. 6 provides a bottom perspective view of a printed circuit board, in isolation, of the exemplary board housing of FIG. 4.
Figure 7:
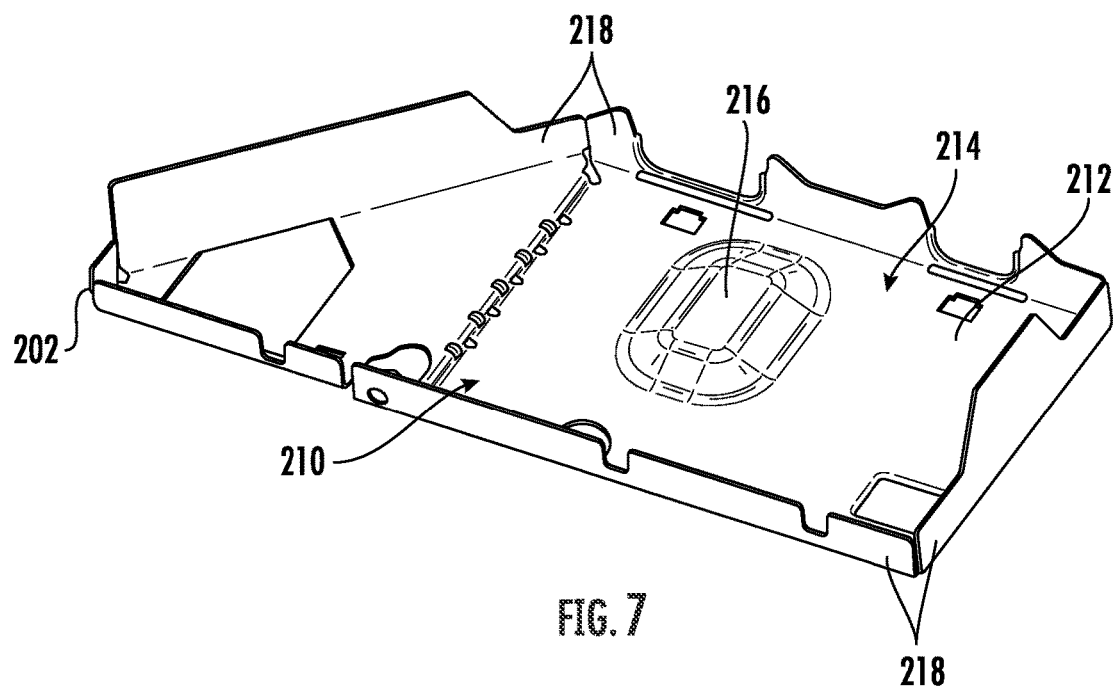
FIG. 7 provides a perspective view of a board pan, in isolation, of the exemplary board housing of FIG. 4.
Figure 8:
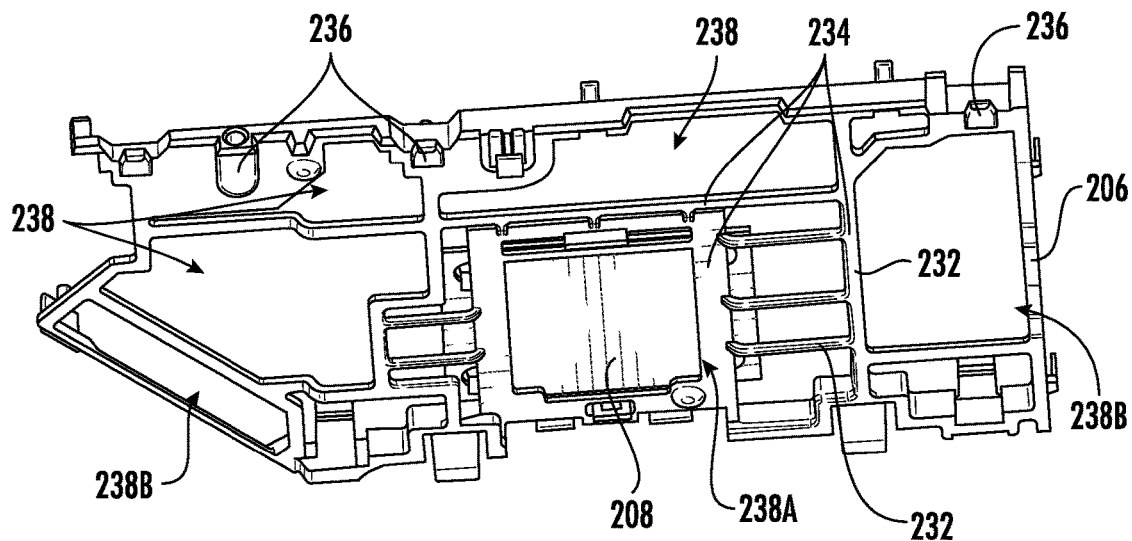
FIG. 8 provides a bottom perspective view of a frame assembly, in isolation, of the exemplary board housing of FIG. 4.
Figure 9:
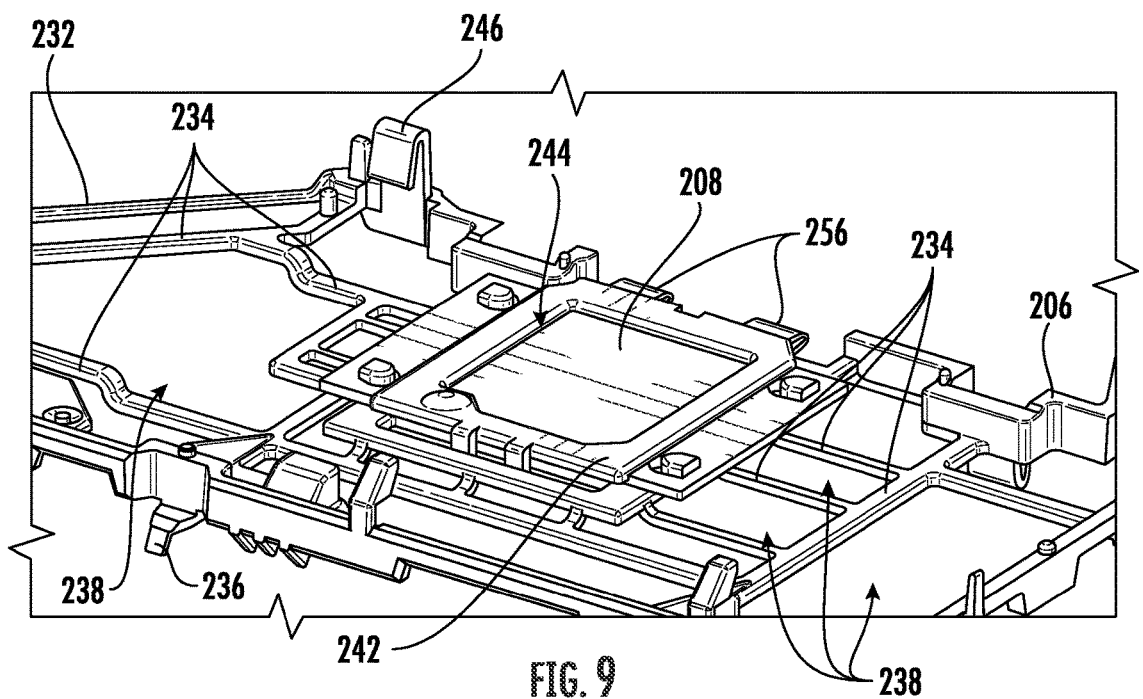
FIG. 9 provides a top perspective view of a portion of the frame assembly, in isolation, of the exemplary board housing of FIG. 4.
Figure 10:
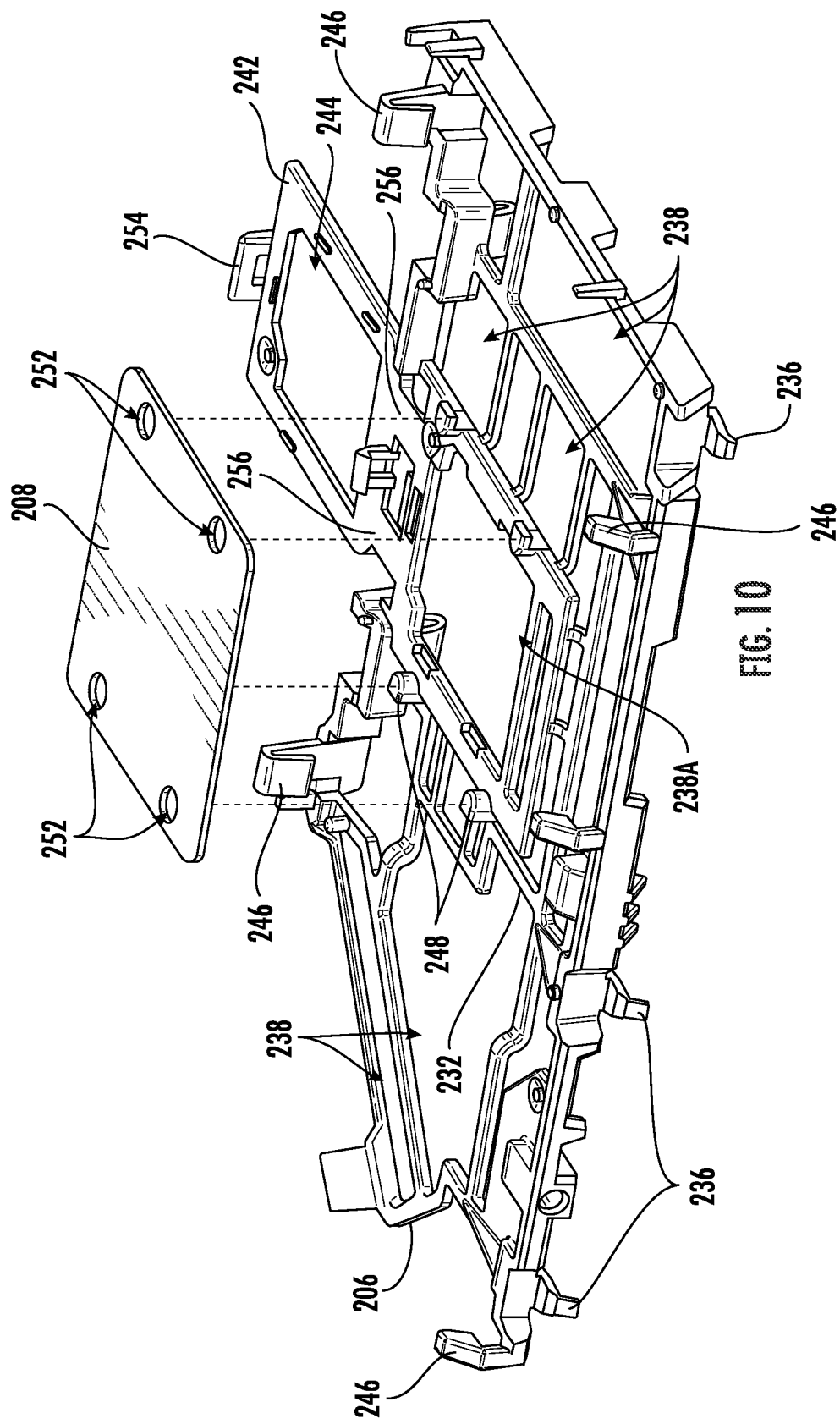
FIG. 10 provides an exploded perspective view of a frame assembly, in isolation, of the exemplary board housing of FIG. 4.
Figure 11:
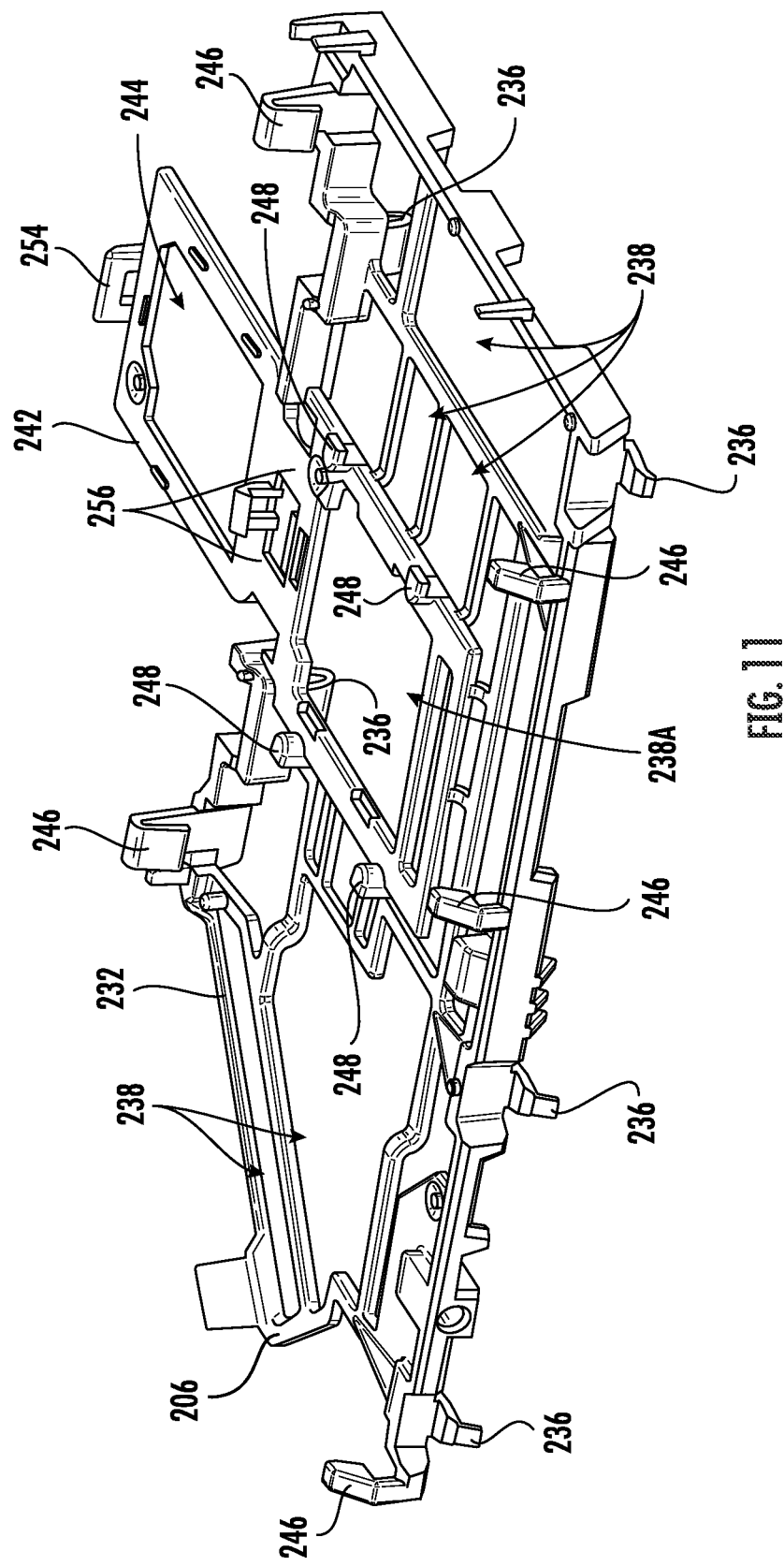
FIG. 11 provides a perspective view of a spacer frame, in isolation, of the exemplary board housing of FIG. 4.
Figure 12:
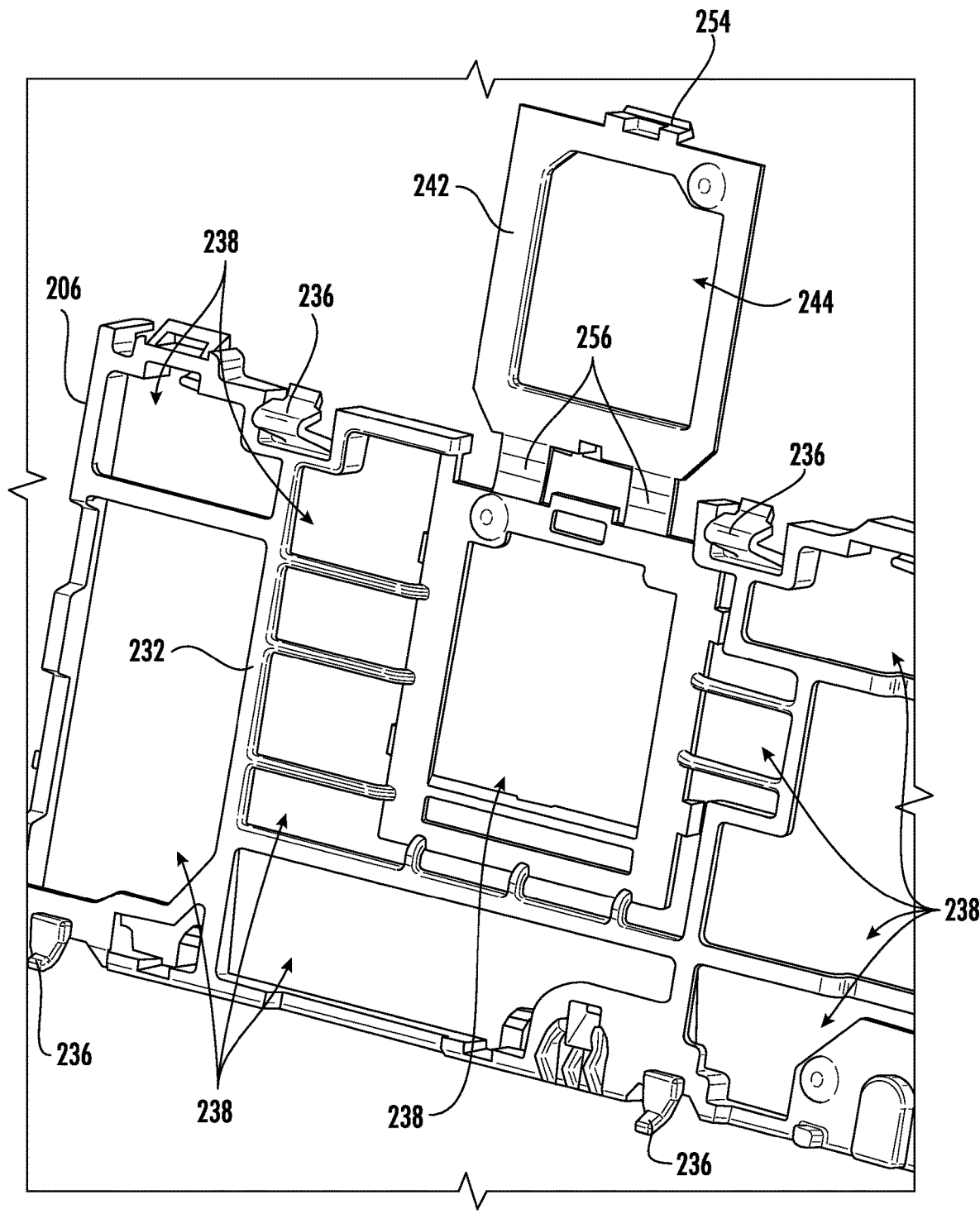
FIG. 12 provides a bottom perspective view of the spacer frame, in isolation, of the exemplary board housing of FIG. 4.

For the remainder of the description, and as shown in FIGS. 2 through 12, directions, including lateral, transverse, and vertical directions, will hereinafter be given in relation to housing 200, which is shown in an exemplary position in dishwasher 100 in FIG. 2 as attached below tub 104. As shown in FIG. 3, lateral, vertical, and transverse directions are hereinafter defined by housing 200. The alignment of these directions as defined by housing 200, may align with or be parallel to the exemplary position of housing 200 in FIG. 2 (where L, V, and T directions are defined relative to dishwasher 100), for clarity of description herein. The position of housing 200 in dishwasher 100 is shown in FIG. 2 for exemplary purposes and for ease in defining directions only; housing 200 could be placed in any number of positions or alignments within dishwasher 100 or, indeed, in any household appliance requiring a board housing 200 as described herein.

Generally, board housing 200 includes multiple separable elements. In some embodiments, board housing 200 includes a housing pan 202, a printed circuit board (PCB) 204, a spacer frame 206, and a thermally conductive insulator pad (TCIP) 208. When assembled, PCB 204, spacer frame 206, and TCIP 208 are all supported on or attached to (e.g., directly or indirectly) housing pan 202.

As shown, housing pan 202 may define a housing chamber or pocket 210 in which PCB 204, spacer frame 206, and TCIP 208 may be held. For instance, housing pan 202 may include one or more walls defining housing pocket 210. Such walls may include a bottom wall 212, which defines an internal bottom surface 214 facing or defining at least a portion of housing pocket 210. Optionally, and as will be described in greater detail below, bottom wall 212 may include a raised ridge 216 that extends upward from a surrounding portion of internal bottom surface 214. In certain embodiments, internal bottom surface 214 is an exposed surface and, thus, free of any additional or insulating material (e.g., apart from TCIP 208). Additionally or alternatively, one or more sidewalls 218 may extend generally along the vertical direction V (e.g., from bottom wall 212). The sidewalls 218 may extend about at least a portion of the housing pocket 210 and, thus, horizontally bound at least a portion of housing pocket 210 (e.g., including one or more elements therein). In some embodiments, the sidewalls 218 bound a horizontal perimeter of housing pan 202. The horizontal perimeter of housing pan 202 may define a pan footprint (e.g., in a horizontal plane) having a set surface area. The pan footprint may generally lie in the same plane as at least a portion of bottom wall 212.

Optionally, housing pan 202 may be formed from or include one or more conductive materials (e.g., steel or aluminum, including alloys thereof). In some such embodiments, internal bottom surface 214 or sidewalls 218 may be exposed metal surfaces, open to housing pocket 210 and not covered by applied insulating material, such as paper or cellulose. Notably, internal bottom surface 214 may facilitate improved heat transfer.

Within housing pan 202 (e.g., within housing pocket 210), PCB 204 may be held. Specifically, PCB 204 may be held above the internal bottom surface 214. When assembled, PCB 204 may be spaced apart from the walls of housing pan 202. For instance, as will be described in detail below, PCB 204 may be held or supported away from internal bottom surface 214. Thus, PCB 204 may be assembled out of direct contact with bottom wall 212 (i.e., in a position or arrangement wherein PCB 204 does not directly contact bottom wall 212 or housing pan 202).

As shown, and as would generally be understood, PCB 204 is provided as a printed circuit assembly that includes a board substrate 222 (e.g., laminate substrate) and one or more electronic components 224 fixed to the board substrate 222. Such electronic components 224 may include one or more circuits, switches, relays, resistors, capacitors, heat sinks, processors, or memory devices in electric communication with each other (e.g., via conductors included with board substrate 222). As an example, a high-heat electronic component 224A, such as an intelligent power management (IPM) module, may be included (e.g., on bottom side 228). Optionally, PCB 204 may be provided as a double-sided board and thus includes electronic components 224 on both a top side 226 and a bottom side 228 of board substrate 222. Additionally or alternatively, controller 160, or at least a portion thereof, is provided on or as part of PCB 204. One or more harness may extend through board housing 200 or housing pocket 210 to connect PCB 204 to, or otherwise facilitate communication with, various other appliance features, as would be understood.

Turning especially to FIGS. 8 through 12, spacer frame 206 may support PCB 204 within or on housing pan 202. For instance, spacer frame 206 may be disposed between at least a portion of PCB 204 and housing pan 202 (e.g., along the vertical direction V). In some embodiments, spacer frame 206 includes a skeletal platform 232 that extends beneath the PCB 204 and onto which PCB 204 is disposed. Optionally, skeletal platform 232 may extend horizontally or be held parallel to at least a portion of internal bottom surface 214. Skeletal platform 232 may further extend to and define a horizontal perimeter of spacer frame 206. The horizontal perimeter of spacer frame 206 may further define a frame footprint (e.g., in a horizontal plane) having a set surface area. The surface area of the frame footprint may be less than the surface area of the pan footprint (e.g., while being parallel to the same). For instance, the surface area of the frame footprint may be less or equal to 67% of the surface area of the pan footprint. Additionally or alternatively, the surface area of the pan footprint may be greater than or equal to 33% of the surface area of the pan footprint.

One or more platform feet 236 may extend (e.g., vertically) from skeletal platform 232 and toward housing pan 202. Platform feet 236 may rest on or contact bottom wall 212 and further hold or stabilize skeletal platform 232 above internal bottom surface 214. Additionally or alternatively, platform feet 236 may hook on or squeeze (e.g., in a resilient friction fit) into a portion of housing pan 202 (e.g., a corresponding hole at bottom wall 212) to secure skeletal platform 232 relative to housing pan 202.

As shown, spacer frame 206 may define one or more frame holes 238 extending therethrough (e.g., along the vertical direction V). For instance, skeletal platform 232 may include a plurality of frame arms 234 that crisscross or span across spacer frame 206 (e.g., horizontally) and define frame holes 238 therebetween. In some embodiments, at least one frame hole (e.g., a primary frame hole 238A) is vertically aligned with an electronic component 224 of PCB 204. For instance, a high-heat component 224A (e.g., IPM module) may be coaxial with the primary frame hole 238A along the vertical direction V. The high-heat component 224A may be disposed on the bottom side 228 of board substrate 222. When assembled, the high-heat component 224A may further sit above or within primary frame hole 238A. High-heat component 224A may have a footprint or perimeter profile that is complementary to primary frame hole 238A. Additionally or alternatively, and as will be described below, a retention door 242 may be provided with a door opening 244 aligned with high-heat component 224A or primary frame hole 238A and which may be complementary to the footprint or perimeter profile of high-heat component 224A.

Optionally, one or more other electronic components 224 (e.g., secondary components 224B disposed on bottom side 228) may be aligned with or held within other frame holes 238 (e.g., secondary frame holes 238B). Such electronic components 224B may have footprints or perimeter profiles that are complementary to those of the corresponding secondary frame holes 238B. Notably, the frame holes 238A, 238B may guide or seat PCB 204 in the desired position on spacer frame 206 (e.g., during the assembly process or without requiring multiple additional components, tools, or knowledge by an assemblyperson).

Optionally, a plurality of friction tabs 246 may be provided to help hold PCB 204 to skeletal platform 232. For instance, such friction tabs 246 may extend (e.g., upward) away from bottom wall 212 or housing pan 202 generally. Moreover, friction tabs 246 may be disposed at the perimeter or outer edge of skeletal platform 232. A resilient hook may define a curved or slanted surface that is held over the footprint of the mounted PCB 204. During assembly, this resilient hook may permit each friction tab to be guided or pushed horizontally outward (i.e., away from pocket 210 or PCB 204) in tandem with downward movement of PCB 204 (e.g., onto skeletal platform 232). Once PCB 204 is in place, each friction tab 246 may then spring horizontally inward (i.e., toward pocket 210 or PCB 204) over or above PCB 204, thereby restricting PCB 204 from being lifted off of or away from spacer frame 206.

Notably, spacer frame 206 may be formed as an integral, unitary, or monolithic structure. For instance, spacer frame 206 may be provided as a continuous insulating polymer piece. In turn, and in contrast to existing assemblies, PCB 204 may be supported on housing pan 202 without requiring complex assembly steps, tools, or knowledge. Additionally or alternatively, additional parts or materials (e.g., insulating materials apart from TCIP 208) may be avoided or done away with in the assembled board housing 200.

As shown, particularly in FIGS. 5 and 8 through 10, TCIP 208 may be held on spacer frame 206. Specifically, TCIP 208 is held between PCB 204 and housing pan 202 (e.g., along the vertical direction V). When assembled, TCIP 208 may span across primary frame hole 238A. Thus, TCIP 208 may be vertically aligned with primary frame hole 238A. Separate from or in addition to primary frame hole 238A, TCIP 208 may be aligned with at least one electronic component 224 (e.g., high-heat component 224A). Moreover, the assembled board housing 200 may provide TCIP 208 in thermally conductive contact with such a component 224. In certain embodiments, one side (e.g., upper side) of TCIP 208 is in thermally conductive contact with one electronic component 224 while an opposite side (e.g., lower side) is in thermally conductive contact with housing pan 202 (e.g., at internal bottom surface 214). Optionally, TCIP 208 may be aligned (e.g., vertically) with raised ridge 216. In turn, the raised ridge 216 is may be held in static contact with the TCIP 208. TCIP 208 may be provided as any suitable thermally conductive, yet electrically isolating material (e.g., composite of aluminum or glassweave and silicone rubber, such as a mat or pad marketed under the SIL PAD® mark). During use, raised ridge 216 may draw heat from TCIP 208 and the electronic component 224 contacting TCIP 208 apart from raised ridge 216. Notably, housing pan 202 may act as a conductive heat sink while avoiding electric communication, interference, or arcing between housing pan 202 and PCB 204.

In certain embodiments, one or more portions of spacer frame 206 hold TCIP 208 in a fixed position relative to skeletal platform 232. As an example, one or more locator tabs 248 may extend (e.g., vertically) from skeletal platform 232 to be received in one or more corresponding locator holes 252 defined through TCIP 208. Such locator tabs 248 may be formed, for instance, on frame arms 234 defining or disposed about primary frame hole 238A. As an additional or alternative example, retention door 242 may selectively clasp to skeletal platform 232 and sandwich TCIP 208 between the two. For instance, retention door 242 may have a latch 254 that engages skeletal platform 232 and holds retention door 242 over TCIP 208 and against skeletal platform 232. When clasped, the door opening 244 of retention door 242 may align with TCIP 208 or primary frame hole 238A. As noted above, door opening 244 may be complementary to the footprint or perimeter profile of high-heat component 224A. In turn, high-heat component 224A may sit within door opening 244. The high-heat component 224A may thus directly contact TCIP 208 through door opening 244. Optionally, a living hinge 256 may pivotally join the retention door 242 to the skeletal platform 232. For instance, the living hinge 256 may connect retention door 242 to skeletal platform 232 apart from the latch 254 or a periphery of skeletal platform 232. As shown, living hinge 256 may provide a reduced-thickness segment of material to define a pivot axis and bias rotation of retention door 242. Notably, assembled alignment of retention door 242 to TCIP 208 or skeletal platform 232 may be predefined and assembly errors may be reduced.

Advantageously, the above-described board housing embodiments may be assembled and without the use of any screws connecting housing pan 202, spacer frame, TCIP, or PCB (e.g., to each other). Additionally or alternatively, such embodiments may ensure consistent, reliable, robust or effective assembly.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An appliance board housing comprising:
   a housing pan defining an internal bottom surface;
   a printed circuit board (PCB) held within the housing pan above the internal bottom surface;
   a spacer frame comprising a skeletal platform extending beneath the PCB in support thereof; and
   a thermally conductive insulator pad (TCIP) held on the spacer frame between PCB and the housing pan,
   wherein the internal bottom surface comprises a raised ridge aligned with the TCIP.

2. The appliance board housing of claim 1, wherein the spacer frame defines a frame hole vertically aligned with an electronic component of the PCB.

3. The appliance board housing of claim 2, wherein the skeletal platform comprises a plurality of frame arms extending parallel to the PCB, and wherein the frame hole is one hole of a plurality of holes defined by the plurality of frame arms.

4. The appliance board housing of claim 3, wherein the PCB comprises a plurality of electronic components held within the plurality of holes.

5. The appliance board housing of claim 1, wherein the raised ridge is held in static contact with the TCIP to draw heat therefrom.

6. The appliance board housing of claim 1, wherein the spacer frame further comprises a plurality of friction tabs extending away from the housing pan and holding the PCB to the skeletal platform.

7. The appliance board housing of claim 1, wherein the spacer frame comprises a retention door selectively clasped to the skeletal platform.

8. The appliance board housing of claim 7, wherein the retention door is held over the TCIP.

9. The appliance board housing of claim 7, further comprising a living hinge pivotally joining the retention door to the skeletal platform.

10. A domestic appliance comprising:
    a cabinet defining a vertical direction; and
    a board housing movably attached to the cabinet, the board housing comprising
    a housing pan defining an internal bottom surface,
    a printed circuit board (PCB) held within the housing pan above the internal bottom surface along the vertical direction,
    a spacer frame comprising a skeletal platform extending beneath the PCB in support thereof, the spacer frame further comprising a retention door selectively clasped to the skeletal platform, and
    a thermally conductive insulator pad (TCIP) held on the spacer frame between PCB and the housing pan.

11. The domestic appliance of claim 10, wherein the spacer frame defines a frame hole vertically aligned with an electronic component of the PCB.

12. The domestic appliance of claim 11, wherein the skeletal platform comprises a plurality of frame arms extending parallel to the PCB, and wherein the frame hole is one hole of a plurality of holes defined by the plurality of frame arms.

13. The domestic appliance of claim 12, wherein the PCB comprises a plurality of electronic components held within the plurality of holes.

14. The domestic appliance of claim 10, wherein the internal bottom surface comprises a raised ridge aligned with the TCIP.

15. The domestic appliance of claim 14, wherein the raised ridge is held in static contact with the TCIP to draw heat therefrom.

16. The domestic appliance of claim 10, wherein the spacer frame further comprises a plurality of friction tabs extending away from the housing pan and holding the PCB to the skeletal platform.

17. The domestic appliance of claim 10, wherein the retention door is held over the TCIP.

18. The domestic appliance of claim 10, further comprising a living hinge pivotally joining the retention door to the skeletal platform.

19. An appliance board housing comprising:
    a housing pan defining an internal bottom surface;
    a printed circuit board (PCB) held within the housing pan above the internal bottom surface;
    a spacer frame comprising a skeletal platform extending beneath the PCB in support thereof, the spacer frame further comprising a retention door selectively clasped to the skeletal platform and a living hinge pivotally joining the retention door to the skeletal platform; and
    a thermally conductive insulator pad (TCIP) held on the spacer frame between PCB and the housing pan;
    wherein the spacer frame comprises a retention door selectively clasped to the skeletal platform.

20. The appliance board housing of claim 19, wherein the retention door is held over the TCIP.

* * * * *